(12) United States Patent
Ma et al.

(10) Patent No.: US 6,780,025 B2
(45) Date of Patent: Aug. 24, 2004

(54) ELECTRICAL CONNECTOR HAVING SLIDE-ON REINFORCEMENT MEMBERS

(75) Inventors: Hao-Yun Ma, Tu-chen (TW); Ming-Lun Szu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/651,927

(22) Filed: Aug. 29, 2003

(65) Prior Publication Data

US 2004/0142585 A1 Jul. 22, 2004

(30) Foreign Application Priority Data

Dec. 25, 2002 (TW) ..................................... 91221052 U

(51) Int. Cl.[7] .............................................. H01R 9/09
(52) U.S. Cl. ...................................................... 439/73
(58) Field of Search .......................... 439/73, 331, 342, 439/330, 72, 71

(56) References Cited

U.S. PATENT DOCUMENTS

| 5,192,213 A | 3/1993 | Kosugi et al. |
| 5,199,889 A | 4/1993 | McDevitt, Jr. |
| 5,232,372 A | 8/1993 | Bradley et al. |
| 5,320,559 A | 6/1994 | Uratsuji et al. |
| 5,344,334 A * | 9/1994 | Laub et al. ................. 439/331 |
| 5,362,241 A | 11/1994 | Matsuoka et al. |
| 5,364,278 A * | 11/1994 | Laub ........................... 439/69 |
| 5,890,914 A * | 4/1999 | Belopolsky et al. .......... 439/73 |
| 6,015,301 A * | 1/2000 | Brodsky et al. .............. 439/73 |
| 6,626,683 B2 * | 9/2003 | Lai ............................. 439/73 |
| 6,648,656 B1 * | 11/2003 | Ma ............................. 439/73 |
| 6,676,429 B1 * | 1/2004 | McHugh et al. ............ 439/331 |
| 6,692,279 B1 * | 2/2004 | Ma ............................ 439/331 |

* cited by examiner

Primary Examiner—P. Austin Bradley
Assistant Examiner—Phuongchi Nguyen
(74) Attorney, Agent, or Firm—Wei Te Chung

(57) ABSTRACT

An electrical connector (1) includes a housing (2) receiving a plurality of contacts (7) therein, an actuator lever (5) assembled with the housing, a frame (4) hinged with the housing and a pair of reinforcement members (3) covering on the housing. The housing defines a pair of rail portions (26, 27) thereon and the reinforcement member defines a pair of guiding slots (312, 322), which enables the reinforcement members to be mounted on the housing by means of sliding on the rail portions. The reinforcement members protect the housing from bending or distortion by the frame when the frame presses down on an IC module received in the housing. This facilitates reliable electrical connection between the IC module and a PCB on which the housing is mounted.

2 Claims, 4 Drawing Sheets

ELECTRICAL CONNECTOR HAVING SLIDE-ON REINFORCEMENT MEMBERS

BACKGROUND OF THE INVENTION

1. Field of the Invention

The present invention relates to an electrical connector used for electrically connecting a land grid array (LGA) integrated circuit (IC) module to a printed circuit board (PCB), and particularly to an electrical connector having a pair of reinforcement members. The invention relates to a copending application Ser. No. 10/453,224 with a title of "ELECTRICAL CONNECTOR WITH METAL STIFFENERS" having the same applicants and the same assignee with the instant application.

2. Description of the Prior Art

An electrical connector used for electrically connecting an LGA IC module to a PCB is widely applied in the field of electronics, and a correlative article is found in *Nonlinear Analysis Helps Design LGA Connectors* (Connector Specifier, February 2001). Examples of this kind of electrical connector are disclosed in U.S. Pat. Nos. 5,192,213, 5,199,889, 5,232,372, 5,320,559 and 5,362,241.

Referring to FIG. 4, a conventional electrical connector 6 used for electrically connecting an LGA IC module 8 (not shown) to a PCB (not shown) comprises a housing 63 receiving a plurality of contacts 64 therein, an actuator lever 62 having an action portion 620 pivotably attached to one end of the housing 63, and a frame 65 hinged with an opposite end of the housing 63. The frame 65 is bent slightly at middle portions thereof, and further forms a sunken portion 650 at an end thereof. The frame 65 is used for pressing and fastening the IC module firmly on the housing 63. To fasten the IC module on the housing 63 of the electrical connector 6, the action portion 620 of the actuator lever 62 is actuated into the sunken portion 650. The action portion 620 presses the frame 65 on the IC module and the housing 63. Because the middle portion of the frame 65 is bent, a middle portion of the housing 63 is prone to warp, and the two ends of the housing 63 are prone to be distorted upwardly where the housing 63 joins with the frame 65 and actuator lever 62. Thus the housing 63 may partially detach from the PCB. When this happens, electrical connection between the LGA IC module 8 and the PCB may be impaired or even lost.

Hence, a new electrical connector having a reinforcement structure is desired to overcome the above-described disadvantages.

SUMMARY OF THE INVENTION

An object of the present invention is to provide an electrical connector having an effective reinforcement structure to ensure reliable electrical connection between an IC module and a PCB.

In order to achieve the aforementioned object, an electrical connector in accordance with a preferred embodiment of the present invention comprises a housing receiving a plurality of contacts therein, an actuator lever assembled with the housing, a frame hinged with the housing and a pair of reinforcement members covering on the housing. The housing defines a pair of rail portions thereon and the reinforcement member defines a pair of guiding slots, which enables the reinforcement members to be mounted on the housing by means of sliding on the rail portions. The reinforcement members protect the housing from bending or distortion by the frame when the frame presses down on an IC module received in the housing. This facilitates reliable electrical connection between the IC module and a PCB on which the housing is mounted.

Other objects, advantages and novel features of the present invention will become more apparent from the following detailed description when taken in conjunction with the accompanying drawings, in which:

DESCRIPTION OF THE PREFERRED EMBODIMENT

Figure 1:
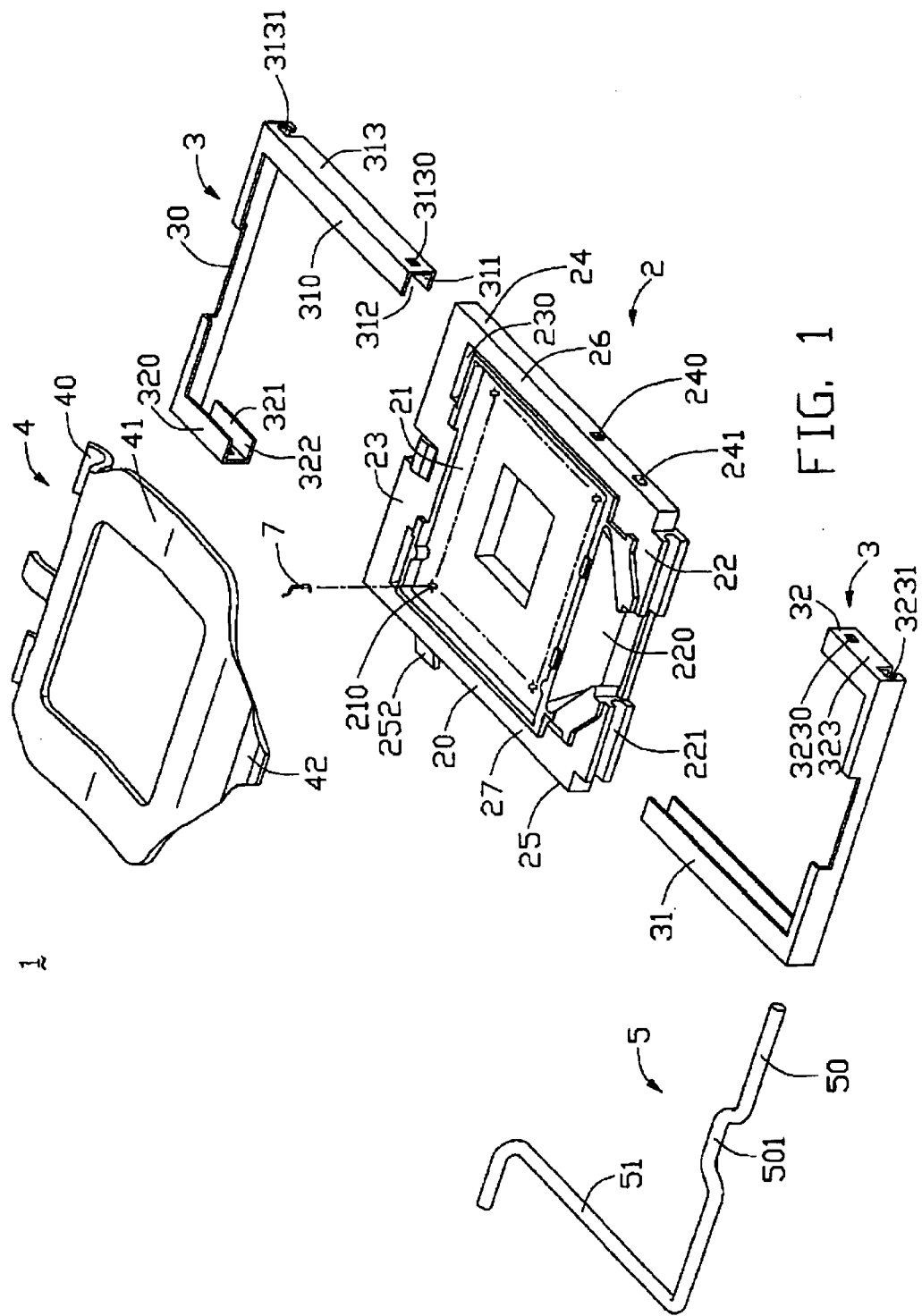
FIG. 1 is a simplified, exploded, isometric view of an electrical connector in accordance with the preferred embodiment of the present invention.

Reference will now be made to the drawing figures to describe the present invention in detail.

Figure 2:
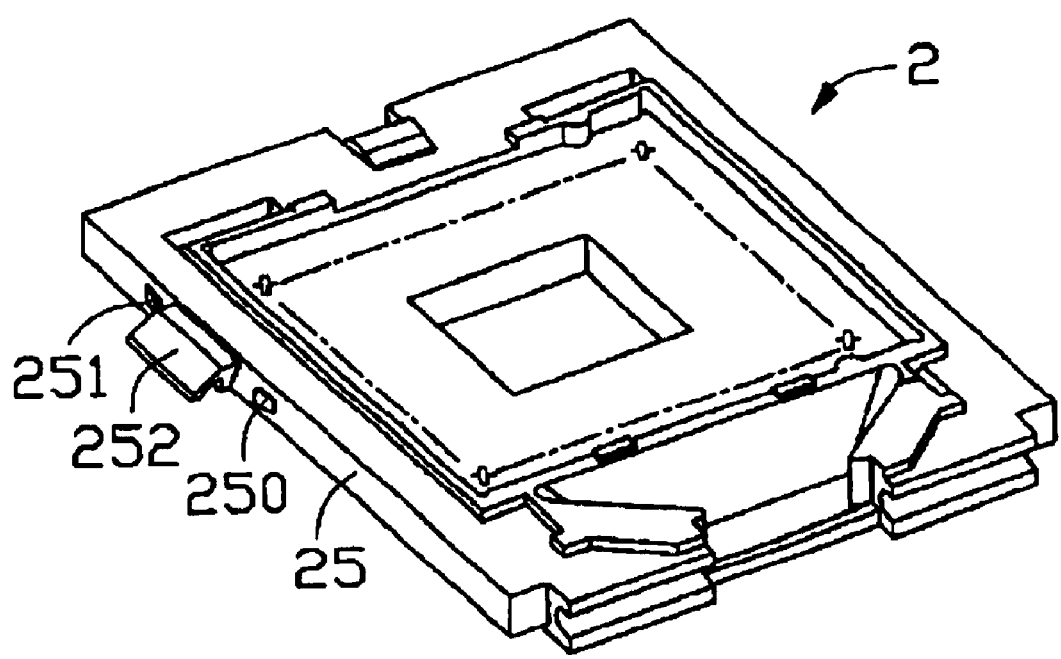
FIG. 2 is an isometric view of a housing of the electrical connector of FIG. 1, viewed from another aspect.
Figure 3:
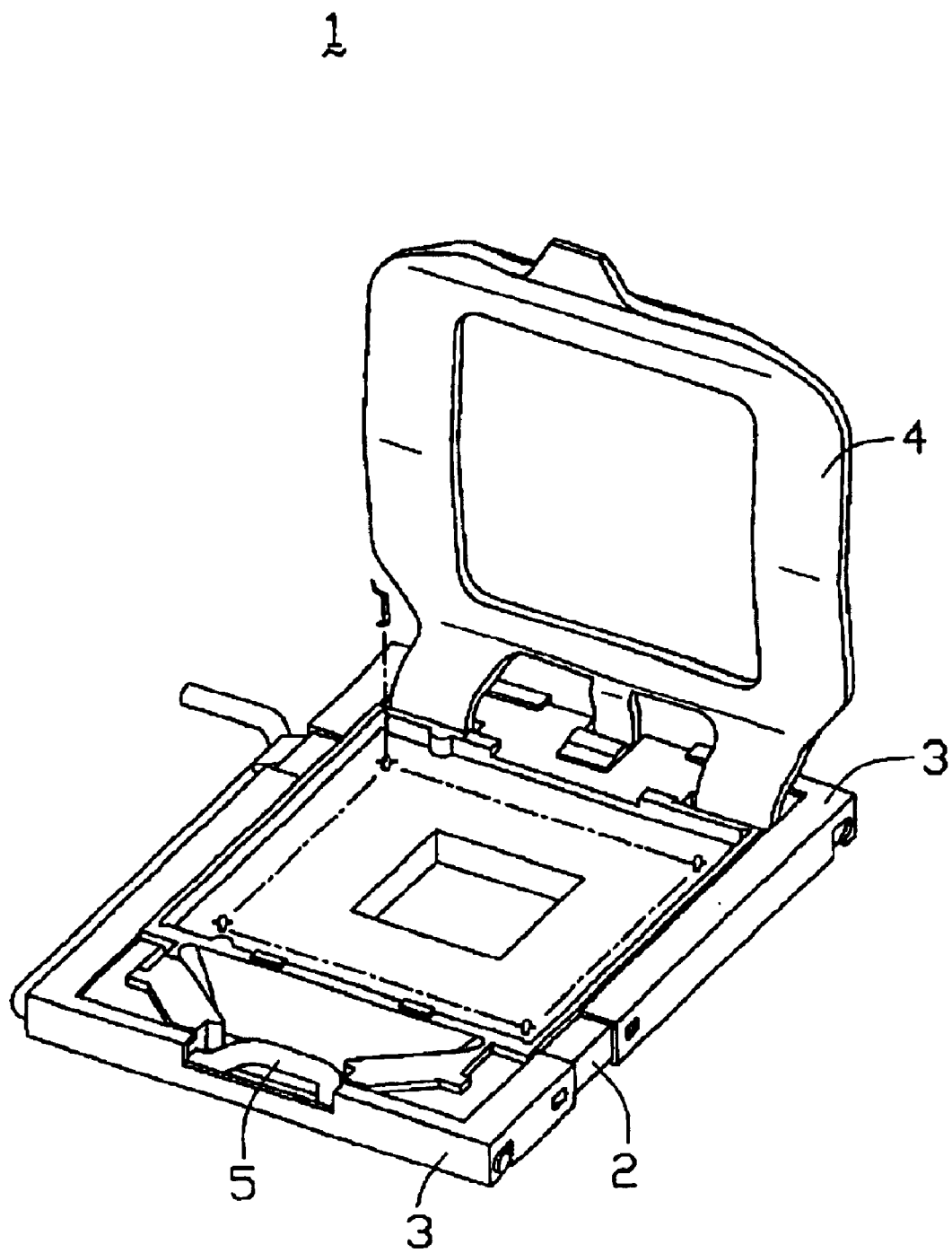
FIG. 3 is an assembled view of FIG. 1.
Figure 4:
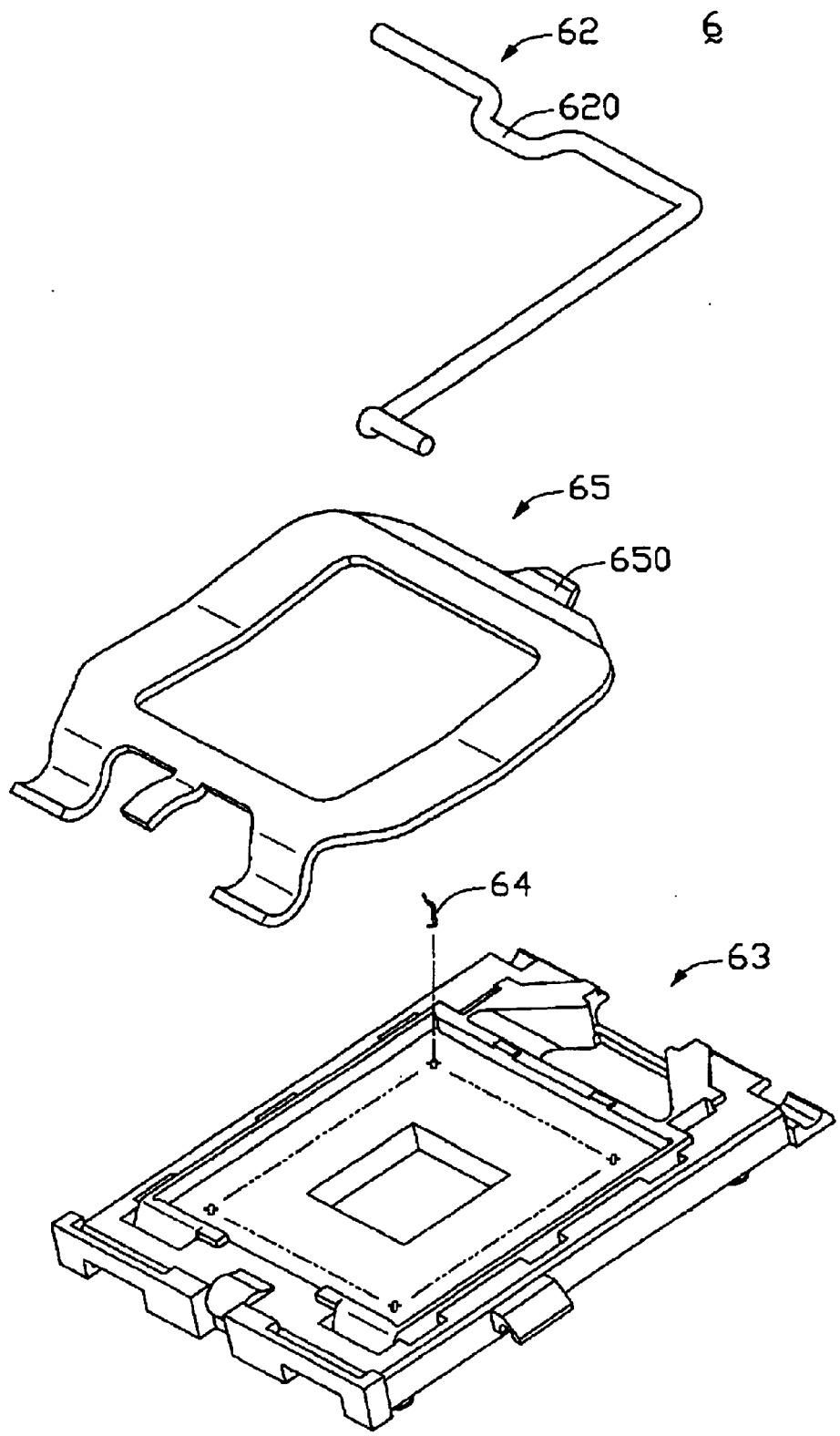
FIG. 4 is a simplified, exploded, isometric view of a conventional electrical connector.

Referring to FIGS. 1–3, an electrical connector 1 is used for electrically connecting an LGA IC module (not shown) to a PCB (not shown). The connector 1 comprises an insulative housing 2 receiving a plurality of contacts 7 therein, a pair of reinforcement members 3 engaged on the housing 2, a frame 4 hinged with the housing 2, and an actuator lever 5 movably attached to the housing 2. The housing 2 comprises an electric area 21 defining a plurality of passageways 210 receiving the contacts 7. An action cavity 220 is defined at one end of the housing 2, adjacent the electric area 21. Said end of the housing 2 defines a receiving space 221 in communication with the action cavity 220, for receiving the actuator lever 5. An opposite end of the housing 2 defines a pair of spaced, aligned pivot slots 230, adjacent the electric area 21. The housing 2 defines a first sidewall 24 and an opposite second sidewall 25. The first sidewall 24 forms a first catch 240 and a second catch 241. The second sidewall 25 forms a third catch 250 and a fourth catch 251. The second sidewall 25 also forms a retaining block 252 positioned between the third and fourth catches 250, 251. The first sidewall 24 comprises a first rail portion 26, and the second sidewall 25 comprises a second rail portion 27.

Each reinforcement member 3 is made of stiff material such as metal. The reinforcement member 3 comprises a base portion 30, and a first guiding portion 31 and a second guiding portion 32 respectively extending perpendicularly from opposite ends of the base portion 30. The first guiding portion 31 is similar to the second guiding portion 32, except that the first guiding portion 31 is longer than the second guiding portion 32. The first guiding portion 31 comprises a first upper beam 310, a first lower beam 311 parallel to the first upper beam 310, and a first side beam 313 perpendicularly interconnecting the first upper and lower beams 310, 311. The first upper, lower and side beams 310, 311, 313 cooperatively define a first guiding slot 312 therebetween. The first side beam 313 defines a first window 3130 and a first opening 3131. The second guiding portion 32 comprises a second upper beam 320, a second lower beam 321, a second side beam 323 interconnecting the second upper and lower beams 320, 321. The second upper, lower and side beams 320, 321, 323 cooperatively define a second guiding slot 322 therebetween. The second side beam 323 defines a second window 3230 and a second opening 3231.

The frame 4 is bent slightly in middle portions of opposite lateral beams thereof, thereby defining two suppressing portions 41 respectively. A middle portion of an end transverse beam of the frame 4 forms a sunken portion 42. An opposite end transverse beam of the frame 4 forms two spaced, curved pivot portions 40. When the frame 4 and the housing 2 are attached together, the pivot portions 40 are movably received in the corresponding pivot slots 230. Thus, the frame 4 is rotatably mounted on the housing 2.

The actuator lever 5 comprises an operation handle 51, and an action portion 50 comprising a medial fixing portion 501. The fixing portion 501 is parallel to but offset from a remainder of the action portion 50. When the actuator lever 5 and the housing 2 are attached together, the action portion 50 of the actuator lever 5 is pivotably received in the receiving space 221.

In assembly of the electrical connector 1, the actuator lever 5 is engaged with a rearward one of the two reinforcement members 3 via the first opening 3131 of the first guiding portion 31 and the second opening 3231 of the second guiding portion 32. The combined rearward reinforcement member 3 and actuator lever 5 is pushed forward onto the housing 2. The first guiding slot 312 of the first guiding portion 31 receives and slides along the second rail portion 27, and the second guiding slot 322 receives and slides along the first rail portion 26. The first window 3130 of the first guiding portion 31 and the second window 3230 of the second guiding portion 32 respectively engagingly receive the third catch 250 and the second catch 241, thereby retaining the rearward reinforcement member 3 on the housing 2. Simultaneously, the actuator lever 5 is received and rotatably retained in the receiving space 221. The forward one of the reinforcement members 3 is pushed rearward onto the housing 2. The first guiding slot 312 of the first guiding portion 31 receives and slides along the first rail portion 26, and the second guiding slot 322 receives and slides along the second rail portion 27. The first window 3130 of the of the first guiding portion 31 and the second window 3230 of the second guiding portion 32 respectively engagingly receive the first catch 240 and the fourth catch 251, thereby retaining the forward reinforcement member 3 on the housing 2. After that, the frame 4 is mounted on the housing 2, with the pivot portions 40 rotatably engaging in the pivot slots 230. Thus the frame 4 is rotatably mounted on the housing 2.

The reinforcement members 3 cooperatively cover substantially an entirety of peripheral portions of the housing 2. Strengths of the reinforcement members 3 are much higher than a strength of the housing 2. Thus when the frame 4 is fastened down on the LGA IC module by the actuator lever 5, the reinforcement members 3 help prevent the housing 2 from bending or deforming. This facilitates reliable electrical connection between the LGA IC module and the PCB on which the housing 2 is mounted. Moreover, because the reinforcement members 3 are slidingly mounted on the housing 2, assembly and disassembly of the electrical connector 1 is easy and convenient.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

What is claimed is:

1. An electrical connector used for electrically connecting an integrated circuit module to a printed circuit board, comprising:

a housing receiving a plurality of contacts therein and defining a plurality of rail portions thereon;

a frame hinged with one end of the housing;

an actuator lever assembled with an opposite end of the housing; and at least one reinforcement member enveloping the housing and defining at least one guiding slot, the at least one guiding slot slidably engaging with the rail portion wherein the electrical connector includes two reinforcement members of same structure;

wherein the reinforcement member defines a base portion, a first guiding portion and a second guiding portion respectively extending perpendicularly from the base portion;

wherein the first guiding portion defines a first upper beam, a first lower beam parallel to the first upper beam, and a first side beam perpendicularly interconnecting the first upper and lower beams, thereby defining a first guiding slot therebetween;

wherein the second guiding portion defines a second upper beam, a second lower beam parallel to the second upper beam, and a second side beam perpendicularly interconnecting the second upper and lower beams, thereby defining a second guiding slot therebetween;

wherein the first guiding portion and the second guiding portion respectively define a first window and a second window;

wherein the housing defines a plurality of catches engaging in the windows of the reinforcement members.

2. An electrical connector assembly comprising:

an insulative housing receiving a plurality of contacts therein;

rail portions formed on a periphery of said housing;

a frame hinged at one lengthwise end of the housing;

an actuator lever pivotally mounted to the other lengthwise end of housing for engagement with the frame; and a reinforcement member defining a longitudinal section enveloping a side edge region of the housing and a transverse section enveloping one of said lengthwise ends of the housing; wherein said longitudinal section defines a U-shaped cross-sectional configuration wherein said reinforcement member further includes another longitudinal section enveloping another side edge region of the housing and connected to said transverse section;

wherein another reinforcement member same as said reinforcement member, is assembled to said housing and cooperates with said reinforcement member to be symmetrically located on the housing.

* * * * *